United States Patent
Wang

(10) Patent No.: US 10,096,373 B2
(45) Date of Patent: Oct. 9, 2018

(54) SHIFT REGISTER AND DRIVING METHOD THEREFOR, GATE DRIVER ON ARRAY CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Junwei Wang, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/515,216

(22) PCT Filed: Aug. 9, 2016

(86) PCT No.: PCT/CN2016/094163
§ 371 (c)(1),
(2) Date: Mar. 29, 2017

(87) PCT Pub. No.: WO2017/124731
PCT Pub. Date: Jul. 27, 2017

(65) Prior Publication Data
US 2018/0240529 A1  Aug. 23, 2018

(30) Foreign Application Priority Data
Jan. 19, 2016  (CN) .......................... 2016 1 0035713

(51) Int. Cl.
G09G 3/36 (2006.01)
G11C 19/28 (2006.01)
G09G 3/20 (2006.01)

(52) U.S. Cl.
CPC ............... *G11C 19/28* (2013.01); *G09G 3/20* (2013.01); *G09G 2310/0286* (2013.01)

(58) Field of Classification Search
CPC ... G11C 19/28; G09G 3/20; G09G 2310/0286
See application file for complete search history.

(56) References Cited

U.S. PATENT DOCUMENTS 8,948,336 B2    2/2015  Qi et al.
2015/0365085 A1*  12/2015  Qing .................... H03K 17/302
                                                              345/100

(Continued)

FOREIGN PATENT DOCUMENTS

CN    102708779 A    10/2012
CN    102800289 A    11/2012

(Continued)

OTHER PUBLICATIONS

International Search Report and Written Opinion for Application No. PCT/CN2016/094163, dated Nov. 9, 2016, 12 Pages.

*Primary Examiner* — Jonathan Boyd
(74) *Attorney, Agent, or Firm* — Brooks Kushman P.C.

(57) ABSTRACT

A shift register, a method for driving a shift register, a gate driver on array (GOA) circuit and a display device are provided. It relates to the field of display technology and solves nonuniform display due to inadequate gate signal in large-sized GOA display products. The shift register for the GOA circuit includes a pulling up (PU) node, a capacitor and an output control module. The output control module comprises a first thin film transistor. A control end of the first thin film transistor is connected to a first end of the capacitor via the PU node, a first clock signal is input to a first end of the first thin film transistor, and a second end of the first thin film transistor is connected to a second end of the capacitor. The shift register further includes a pre-charging module, used to receive a signal from the PU node and output, before the shift register outputs a valid voltage, a pre-charging voltage having an identical polarity to the valid voltage to an output terminal of the shift register.

15 Claims, 6 Drawing Sheets

(56) References Cited

U.S. PATENT DOCUMENTS

2015/0371716 A1* 12/2015 Shao .................... G11C 19/287
                                                    345/100
2016/0093264 A1    3/2016 Gu et al.

FOREIGN PATENT DOCUMENTS

CN          104240766 A     12/2014
CN          105654991 A      6/2016

* cited by examiner

English Translation
BOED0570PUSA (PIUS1720042CN)

1/6

SHIFT REGISTER AND DRIVING METHOD THEREFOR, GATE DRIVER ON ARRAY CIRCUIT AND DISPLAY DEVICE

CROSS-REFERENCE TO RELATED APPLICATIONS

This application is the U.S. national phase of PCT Application No. PCT/CN2016/094163 filed on Aug. 9, 2016, which claims priority to Chinese Patent Application No. 201610035713.0 filed on Jan. 19, 2016, the disclosures of which are incorporated in their entirety by reference herein.

TECHNICAL FIELD

The present disclosure relates to the field of display technology, in particular to a shift register, a method for driving a shift register, a gate driver on array circuit and a display device.

BACKGROUND

With the gate driver on array (GOA) technique, the manufacturing process is simplified, the integration degree is enhanced, and neither gate chip bonding region nor Fan-out wiring region should be arranged at the border, thereby achieving narrow border design.

SUMMARY

The present disclosure provides a shift register, a method for driving a shift register, a GOA circuit and a display device, to solve nonuniform display due to inadequate gate signal in large-sized GOA display products.

Technical solutions of the present disclosure are given as follows.

The present disclosure, in some embodiments, provides a shift register for a GOA circuit. The shift register includes: a pulling up (PU) node, a capacitor and an output control module. The output control module includes a first thin film transistor, a control end of the first thin film transistor is connected to a first end of the capacitor via the PU node, a first clock signal is input to a first end of the first thin film transistor, and a second end of the first thin film transistor is connected to a second end of the capacitor. The shift register further includes a pre-charging module, used to receive a signal from the PU node and output, before the shift register outputs a valid voltage, a pre-charging voltage having an identical polarity to the valid voltage to an output terminal of the shift register.

Optionally, the pre-charging module includes a second thin film transistor, a third thin film transistor, a fourth thin film transistor and a fifth thin film transistor. A pre-charging control signal is input to both a control end and a first end of the second thin film transistor that are connected to each other. A control end of the third thin film transistor is connected to a second end of the second thin film transistor, and a first end of the third thin film transistor is connected to the output terminal of the shift register. A first end of the fourth thin film transistor is connected to a second end of the third thin film transistor, and both a control end and a second end of the fourth thin film transistor are connected to the PU node. A control end and a first end of the fifth thin film transistor are connected to each other, and are connected to the second end of the capacitor and the second end of the first thin film transistor; and a second end of the fifth thin film transistor is connected to the output terminal of the shift register.

Optionally, a second clock signal serves as the pre-charging control signal, and the second clock signal and the first clock signal are of opposed phases.

The present disclosure, in some embodiments, provides a GOA circuit including multiple above-mentioned shift registers.

Optionally, the shift registers are cascaded, the output terminal of each shift register is connected to one gate line, a second clock signal serves as the pre-charging control signal, and the second clock signal and the first clock signal are of opposed phases.

Optionally, the output terminal of each shift register is connected to one gate line, shift registers connected to odd-numbered rows of gate lines are cascaded, and shift register connected to even-numbered gate lines are cascaded. A pre-charging control signal used by one shift register is identical to a clock signal used by a shift register connected to a previous row of gate line.

The present disclosure, in some embodiments, provides a display device including any above-mentioned GOA circuit.

The present disclosure, in some embodiments, provides a method for driving a shift register. The shift register includes a pulling up (PU) node, a capacitor and an output control module. The output control module includes a first thin film transistor, a control end of the first thin film transistor is connected to a first end of the capacitor via the PU node, a first clock signal is input to a first end of the first thin film transistor, and a second end of the first thin film transistor is connected to a second end of the capacitor. The shift register further includes a pre-charging module, used to receive a signal from the PU node and output, before the shift register outputs a valid voltage, a pre-charging voltage having an identical polarity to the valid voltage to an output terminal of the shift register. The method includes a step of outputting, by the pre-charging module, the pre-charging voltage having the identical polarity to the valid voltage to the output terminal of the shift register, in a pulling-up stage before the shift register outputs the valid voltage.

Optionally, the pre-charging module includes a second thin film transistor, a third thin film transistor, a fourth thin film transistor and a fifth thin film transistor. A pre-charging control signal is input to both a control end and a first end of the second thin film transistor that are connected to each other. A control end of the third thin film transistor is connected to a second end of the second thin film transistor, and a first end of the third thin film transistor is connected to the output terminal of the shift register. A first end of the fourth thin film transistor is connected to a second end of the third thin film transistor, and both a control end and a second end of the fourth thin film transistor are connected to the PU node. A control end and a first end of the fifth thin film transistor are connected to each other, and are connected to the second end of the capacitor and the second end of the first thin film transistor; and a second end of the fifth thin film transistor is connected to the output terminal of the shift register. The step of outputting, by the pre-charging module, the pre-charging voltage having the identical polarity to the valid voltage to the output terminal of the shift register, in the pulling-up stage before the shift register outputs the valid voltage includes: supplying, by the pre-charging control signal via the second thin film transistor and the third thin film transistor, the pre-charging voltage having the identical polarity to the valid voltage to the output terminal of the shift register, when the PU node is pulled up to a high level and the pre-charging control signal is at a high level, where the first clock signal is at a low level, the fifth transistor is turned off, a signal at the output terminal of the shift register do not affect a level at the second end of the capacitor, and the capacitor is normally charged by the PU node at this stage; and stopping, by the pre-charging control signal, supplying the pre-charging voltage to the output terminal of the shift register and supplying, by the first clock signal, the valid voltage to the output terminal of the shift register normally, when the PU node is at a high level, the pre-charging control signal is turned into a low level, the first clock signal is turned into a high level, the third thin film transistor is turned off, and the first thin film transistor and the fifth thin film transistor are turned on.

In the shift register and the driving method therefor, the GOA circuit and the display device according to the embodiments of the present disclosure, the pre-charging module is added into the shift register. The pre-charging module receives the signal from the PU node, and outputs, before the shift register outputs the valid voltage, the pre-charging voltage having the identical polarity to the valid voltage to the output terminal of the shift register. Due to the pre-charging voltage, before scanning a current row of gate line (before the shift register corresponding to the current row of gate line outputs the valid voltage), electric charges are already accumulated at the thin film transistor connected to the current row of gate line. When scanning the current row of gate line, there are already electric charges accumulated at the thin film transistor and the current row of gate line is driven by the valid voltage; hence, the gate line can be turned on rapidly, thereby solving the problem of nonuniform display due to inadequate gate signal in large-sized GOA display products.

BRIEF DESCRIPTION OF THE DRAWINGS

For clarifying technical solutions according to embodiments of the present, drawings to be used in descriptions of the embodiments are briefly introduced. Apparently, the drawings described hereinafter are merely for some embodiments of the present disclosure and the ordinary skilled in the art can obtain other drawings based on the described drawings without paying creative efforts.

Numerical references are described as follows: 10—shift register, 11—output control module, 12—pre-charging module.

DETAILED DESCRIPTION OF THE EMBODIMENTS

Technical solutions according to embodiments of the present disclosure are described clearly and completely hereinafter in conjunction with the drawings used in the embodiments of the present disclosure. Apparently, the described embodiments are only a part of embodiments of the present application rather than all the embodiments.

Figure 1:
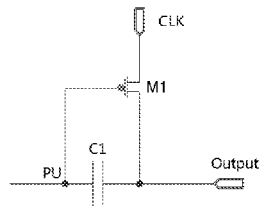
FIG. 1 is a schematic circuit diagram of an output control part of a shift register in the related art.

A GOA circuit includes multiple cascaded shift registers. FIG. 1 illustrates an output control part of a shift register in the related art. In the shift register in the related art, a first thin film transistor M1 may output a signal under control of a pulling up (PU) node. A signal at the PU node includes information when M1 is turned on and when a valid voltage is output. Herein, the circuit of the shift register is improved such that the shift register itself has a pre-charging function; that is, a signal output by the shift register in the present disclosure has a pre-charging function. Specifically, a control signal may be received from the PU node and information about various operation stages of the shift register can be acquired from the control signal. A pre-charging voltage having an identical polarity to the valid voltage can be supplied to the output terminal of the shift register before the shift register outputs the valid voltage; hence, the shift register can fulfill a pre-charging function and problem of inadequate gate signal is solved.

Figure 2:
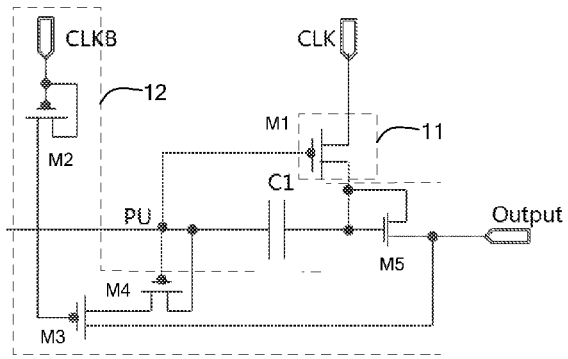
FIG. 2 is a schematic circuit diagram of a part of a shift register in some embodiments of the present disclosure.

Specifically, a shift register for a GOA circuit is provided in some embodiments of the present disclosure. FIG. 2 illustrates merely a part of the circuit of the shift register relevant to the present disclosure. As shown in FIG. 2, the shift register includes: a PU node, a capacitor C1 and an output control module 11. The output control module 11 includes a first thin film transistor M1. A control end of the first thin film transistor M1 is connected to a first end of the capacitor C1 via the PU node, a first clock signal CLK is input to a first end of the first thin film transistor M1, and a second end of the first thin film transistor M1 is connected to a second end of the capacitor C1. The shift register further includes a pre-charging module 12 that is used to receive a signal from the PU node and output, before the shift register outputs a valid voltage, a pre-charging voltage having an identical polarity to the valid voltage to an output terminal Output of the shift register.

In the present disclosure, a pre-charging function is achieved by the pre-charging module 12. The pre-charging module 12 receives a control signal from the PU node to acquire information indicating an operation stage of the shift register, and the pre-charging module 12 can output the pre-charging voltage to the output terminal Output of the shift register just before the shift register outputs the valid voltage, thereby solving the problem of inadequate gate signal output by the shift register. Specific structure of the pre-charging module 12 is not limited in the present disclosure and the ordinary skilled in the art may design the structure of the pre-charging module 12 based on actual situation, as long as the pre-charging module 12 can output the pre-charging voltage having the identical polarity to the valid voltage under the control of the signal from the PU node before the shift register outputs the valid voltage. Electric charges can be accumulated only if the pre-charging voltage and the valid voltage have the identical polarity, thereby shortening time spent on transmitting the gate signal. The value of the pre-charging voltage is not limited and can be determined based on actually required effects through experiment.

Correspondingly, a method for driving the above shift register is provided in some embodiments of the present disclosure. For example, the method includes: outputting, by the pre-charging module, the pre-charging voltage having the identical polarity to the valid voltage to the output terminal of the shift register, in a pulling-up stage before the shift register outputs the valid voltage.

In some embodiments, the pre-charging module 12 includes: a second thin film transistor M2, a third thin film transistor M3, a fourth thin film transistor M4 and a fifth thin film transistor M5. A pre-charging control signal, e.g., CLKB is input to both a control end and a first end of the second thin film transistor M2 that are connected to each other. A control end of the third thin film transistor M3 is connected to a second end of the second thin film transistor M2, and a first end of the third thin film transistor M3 is connected to the output terminal Output of the shift register. A first end of the fourth thin film transistor M4 is connected to a second end of the third thin film transistor M3, and both a control end and a second end of the fourth thin film transistor M4 are connected to the PU node. A control end and a first end of the fifth thin film transistor M5 are connected to each other, and are connected to the second end of the capacitor C1 and the second end of the first thin film transistor M1; and a second end of the fifth thin film transistor M5 is connected to the output terminal Output of the shift register.

A second clock signal CLKB, serving as the pre-charging control signal, and the first clock signal CLK are of opposed phases. The pre-charging control signal can adopt a clock signal that is used by a current stage of shift register and different from CLK. The corresponding driving method is described as follows.

Figure 3:
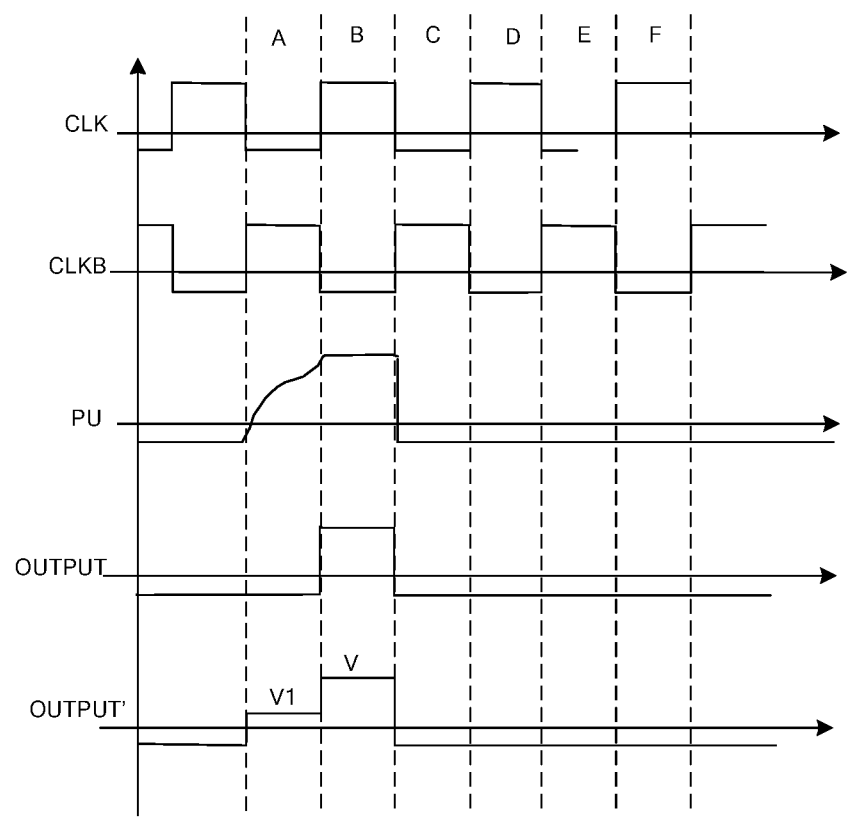
FIG. 3 is an operation sequence diagram for the shift register shown in FIG. 2.

As shown in FIG. 3, during the pulling-up stage (stage A in FIG. 3) before the shift register outputs the valid voltage, the PU node is pulled up to a high level, the pre-charging control signal (CLKB) is at a high level, and the pre-charging control signal (CLKB) supplies a pre-charging voltage V1 having an identical polarity to a valid voltage V to the output terminal Output of the shift register via the second thin film transistor M2 and the third thin film transistor M3. At this stage, the first clock signal CLK is at a low level, the fifth thin film transistor M5 is turned off, and a signal at the output terminal Output of the shift register may not affect a level at the second terminal (the right one) of the capacitor C1; hence, at this stage, the capacitor C1 is normally charged by the PU node. When the PU node is at a high level, the pre-charging control signal is at a low level and the first clock signal CLK is at a high level (stage B shown in FIG. 3), the third thin film transistor M3 is turned off, the first and the fifth thin film transistors M1 and M5 are turned on, the pre-charging control signal stops supplying the pre-charging voltage V1 to the output terminal Output of the shift register, while the first clock signal CLK normally supplies the valid voltage V to the output terminal Output of the shift register.

During stage A, CLKB is at a high level, M3 is turned on, the second clock signal CLKB supplies, via the second thin film transistor M2 and the third thin film transistor M3, the pre-charging voltage V1 to the output terminal Output of the shift register. The pre-charging voltage V1 needs to be supplied via TFT elements such as M2 and M3, an output of M3 may be affected by M4; hence, the value of the pre-charging voltage V1 can be determined based on pre-charging requirements, and electrical characters of M2, M3 and M4 may be determined, i.e., width to length ratio W/L of a channel of each of M2, M3 and M4 may be adjusted, to control the pre-charging performance. In actual, it is necessary to estimate relationships among different TFT elements (mainly M2, M3 and M4) and design with various values of the width to length ratio W/L of the channel (mainly to adjust the width to length ratio of the channel of M3). At this stage, CLK is at a low level, the PU node is pulled to a high level, M5 is turned off, the pre-charging voltage V1 at the output terminal Output of the shift register may not affect the level at the second end of the capacitor C1, and the second end of the capacitor C1 is maintained at a low level.

During stage B, CLKB is at a low level, M3 is turned off, CLKB stops supplying the pre-charging voltage to the output terminal Output of the shift register. CLK is at a high level, the PU node is maintained at a high level, M1 and M5 are turned on, and the first clock signal CLK normally supplies the valid voltage V to the output terminal Output of the shift register.

The pre-charging module provided in the embodiments of the present disclosure can output the pre-charging voltage V1 at a previous clock period before the valid voltage V is output, and the outputting of V1 may not affect the outputting of the valid voltage V1 at an outputting stage. A shift register including the above-described pre-charging module has a pre-charging function.

A GOA circuit is further provided in some embodiments of the present disclosure, including any above-mentioned shift register. With the GOA in the present disclosure, nonuniform display due to inadequate gate signal in large-size products can be solved. Compared with increasing valid voltage of the gate signal in the related technology to ensure a relatively good charging effect, the solution of the GOA in the present disclosure can ensure the charging effect of pixels as well as avoid high power-consumption and high voltage caused in related technology.

For better understanding the solution of embodiments of the present disclosure by the ordinary skilled in the art, detailed implementations of the GOA circuit in the present disclosure are given hereinafter.

Figure 4:
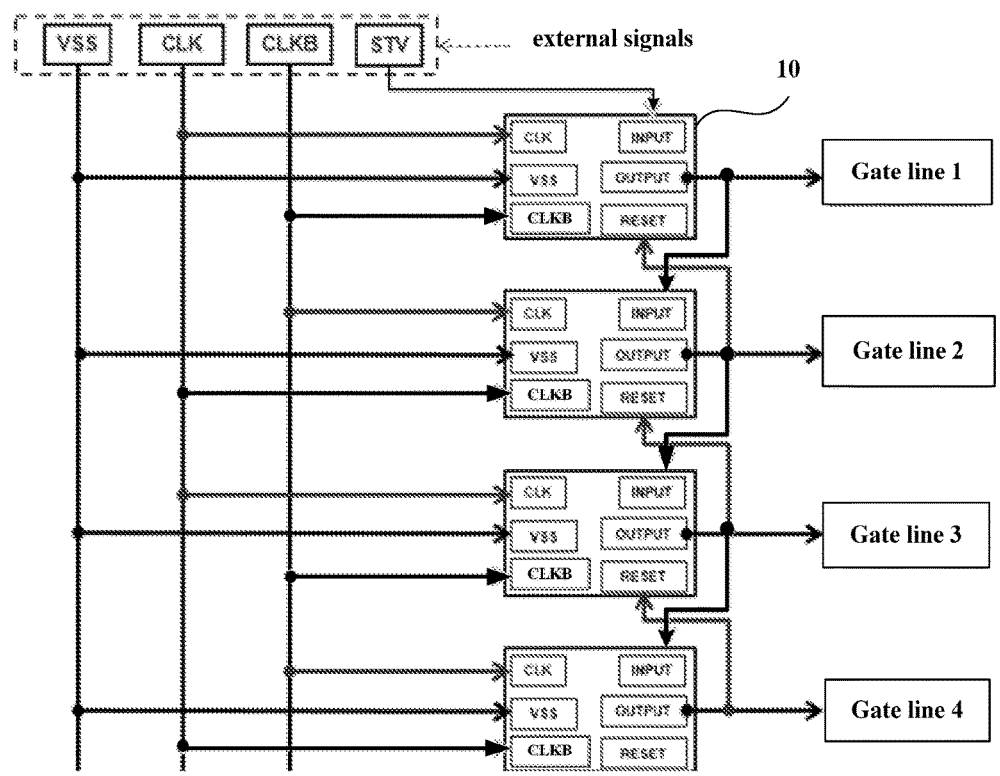
FIG. 4 is a schematic circuit diagram of a single-group driving GOA circuit in some embodiments of the present disclosure.

As shown in FIG. 4 illustrating a single-group driving GOA circuit, shift registers 10 are cascaded, an output terminal Output of each shift register 10 is connected to one gate line. Each shift register 10 operates under two clock signals CLK and CLKB. The shift register 10 is identical to the shift register according to the foregoing embodiments. A second clock signal CLKB serves as a pre-charging control signal, and CLKB and a first clock signal CLK are of opposed phases. The pre-charging control signal may adopt the second clock signal CLKB of a current stage of shift register. Specific working procedure of the GOA circuit in FIG. 4 may be understood with reference to that of FIG. 3, and is accordingly not repeated herein.

Figure 5:
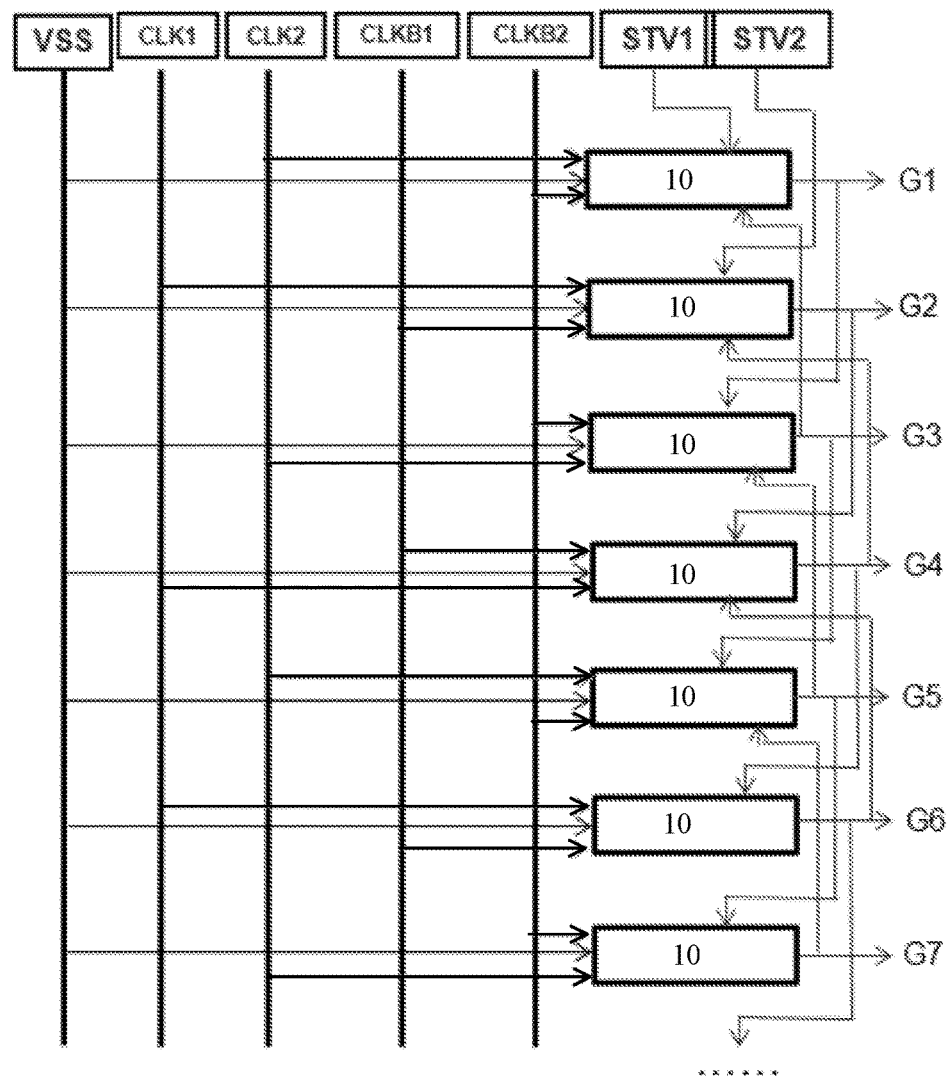
FIG. 5 is a schematic circuit diagram of a double-group driving GOA circuit in some embodiments of the present disclosure.

As shown in FIG. 5 illustrating a double-group driving GOA circuit, an output terminal output of each shift register 10 is connected to one gate line. Shift registers 10 connected to odd-numbered rows of gate lines are cascaded and each operates under two clock signals CLK2 and CLKB2. Shift registers 10 connected to even-numbered rows of gate lines are cascaded and each operates under two clock signals CLK1 and CLKB1. The shift register 10 herein is identical to the shift register according to the foregoing embodiments. The pre-charging control signal for one shift register 10 may be a clock signal used by the shift register 10 connected to a previous row of gate line; that is, the pre-charging control signal for one group may adopt any clock signal for another group. For example, the shift register 10 connected to a first row of gate line uses the clock signals CLK2 and CLKB2, and CLK1 or CLKB1 may serve as the pre-charging control signal for the shift register 10 connected to the first row of gate line; the shift register 10 connected to a second row of gate line uses the clock signals CLK1 and CLKB1, and CLK2 or CLKB2 may serve as the pre-charging control signal for the shift register 10 connected to the second row of gate line.

Figure 6:
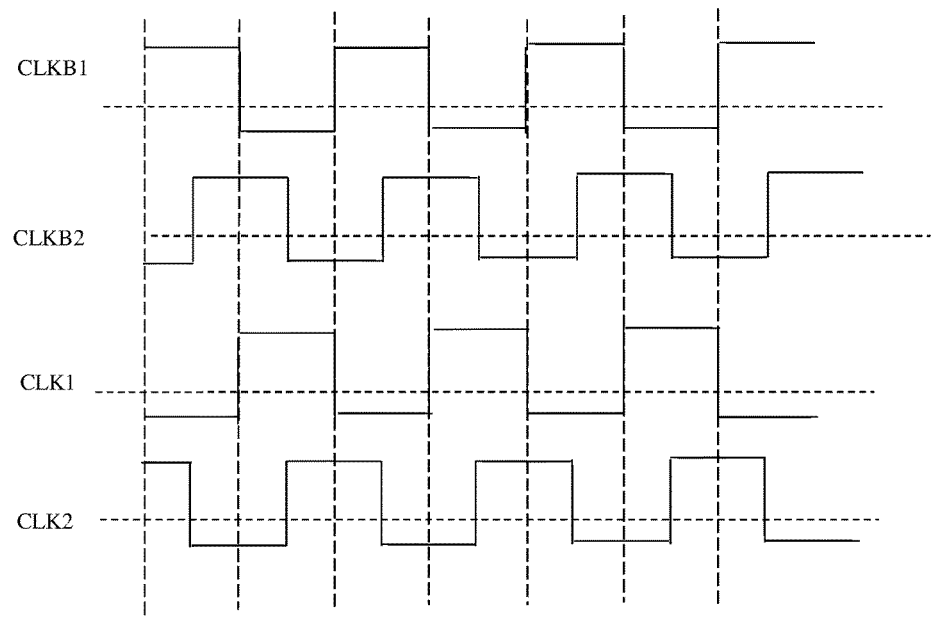
FIG. 6 is a schematic diagram of controls signals for the GOA circuit shown in FIG. 5.
Figure 7:
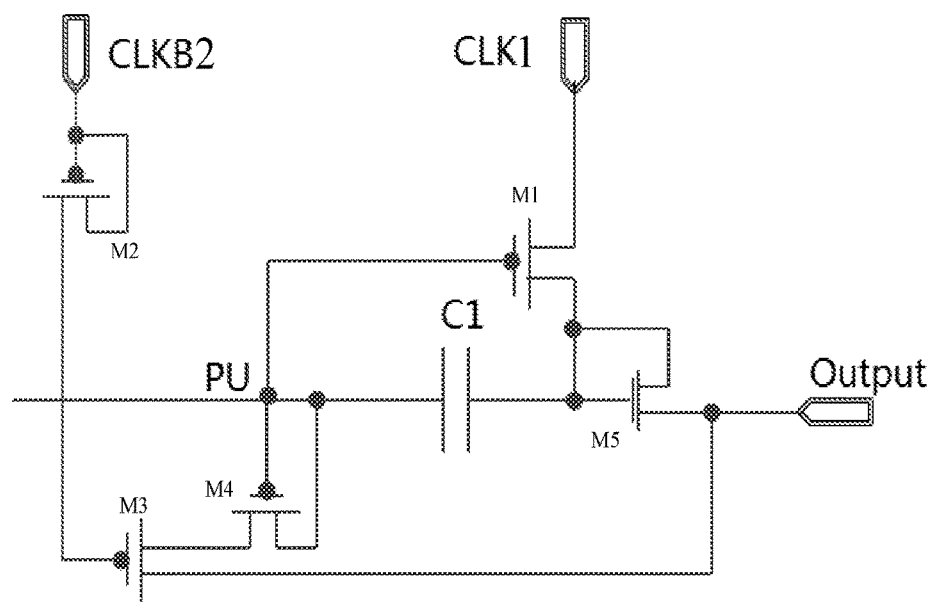
FIG. 7 is a schematic diagram of a shift register in the GOA circuit shown in FIG. 5.

Operation of the GOA circuit in FIG. 5 is substantially similar to that of the shift register shown in FIG. 3, and the specific operation procedure may refer to the time sequence of FIG. 6. It is supposed that the odd-numbered rows of gate lines correspond to a GOA under control of CLK1 and CLKB1 and the even-numbered rows of gate lines correspond to a GOA under control of CLK2 and CLKB2. As shown in FIG. 6, CLKB2 is ¼ period in advance with respect to CLK1. As shown in FIG. 7, in the case that the GOA under control of CLK1 and CLKB1 adopts CLKB2 as a pre-charging control signal, when CLK1 is at a low level and CLKB2 is at a high level, the GOA under control of CLK1 and CLKB1 outputs the pre-charging voltage to fulfill a pre-charging function; when CLK1 is at a high level and CLKB2 is at a high level, each of CLK1 and CLKB2 supplies a high level to the output terminal Output, thereby enhancing the output; and when CLK1 is at a high level and CLKB2 is turned into a low level, only CLK1 supplies a high level to the output terminal Output, which corresponds to a stage of outputting the valid voltage.

The GOA circuit provided in the present disclosure has a pre-charging function, and can be applied to either single-sided driving (with a single GOA) or a double-sided driving (with two GOAs), which avoids nonuniform display due to inadequate gate signal in large-sized GOA products and ensures the charging effect of the pixels.

A display device is further provided in some embodiments of the present disclosure, including any above-mentioned GOA circuit. Valid voltage of a gate line in the display device is small, thereby saving energy. In addition, the nonuniform display due to inadequate gate signal in large-sized GOA products is solved and the charging effect of the pixels is ensured. The display device may be embodied as a product or a component having a displaying function, such as a liquid crystal panel, an electronic paper, an OLED panel, a cellular phone, a tablet computer, a television set, a display, a laptop computer, a digital frame or a navigator.

For clarity, terms such as "first" and "second" are used to distinguish similar components, while those terms are merely exemplary and do not indicate any specific numbers. Variations and extensions made by the ordinary skilled in the art based on the present disclosure all fall in the scope of the present disclosure.

It is understood by the ordinary skilled in the art, all or part of the processes in the method according to the embodiments of the present disclosure can be performed by a hardware instructed by computer program. The program may be stored in a computer accessible storage medium, and the processes of each method can be performed when the program is executed. The storage medium may include disk, compact disc, read-only memory (ROM) or random access memory (RAM).

The above-described embodiments are merely preferred embodiments of the present disclosure. It should be noted that, the scope of the present disclosure is not limited by the preferred embodiments; the ordinary skilled in the art can make various modifications and replacement without departing from the principle of the present disclosure, and all these modifications and replacement shall fall within the scope of protection of the present disclosure. The scope of the present disclosure is defined by the claims.

What is claimed is:

1. A shift register, comprising a pulling up (PU) node, a capacitor and an output control module, wherein the output control module comprises a first thin film transistor, a control end of the first thin film transistor is connected to a first end of the capacitor via the PU node, a first clock signal is input to a first end of the first thin film transistor, and a second end of the first thin film transistor is connected to a second end of the capacitor; and
   wherein the shift register further comprises a pre-charging module, configured to receive a signal from the PU node and output, before the shift register outputs a valid voltage, a pre-charging voltage having an identical polarity to the valid voltage to an output terminal of the shift register.

2. The shift register according to claim 1, wherein the pre-charging module comprises a second thin film transistor, a third thin film transistor, a fourth thin film transistor and a fifth thin film transistor;
   a pre-charging control signal is input to both a control end and a first end of the second thin film transistor that are connected to each other;
   a control end of the third thin film transistor is connected to a second end of the second thin film transistor, and a first end of the third thin film transistor is connected to the output terminal of the shift register;
   a first end of the fourth thin film transistor is connected to a second end of the third thin film transistor, and both a control end and a second end of the fourth thin film transistor are connected to the PU node; and
   a control end and a first end of the fifth thin film transistor are connected to each other, and are connected to the second end of the capacitor and the second end of the first thin film transistor; and a second end of the fifth thin film transistor is connected to the output terminal of the shift register.

3. The shift register according to claim 2, wherein a second clock signal serves as the pre-charging control signal, and the second clock signal and the first clock signal are of opposed phases.

4. A gate driver on array (GOA) circuit, comprising a plurality of shift registers, wherein each shift register comprises a pulling up (PU) node, a capacitor and an output control module, wherein the output control module comprises a first thin film transistor, a control end of the first thin film transistor is connected to a first end of the capacitor via the PU node, a first clock signal is input to a first end of the first thin film transistor, and a second end of the first thin film transistor is connected to a second end of the capacitor; and
   wherein the shift register further comprises a pre-charging module, configured to receive a signal from the PU node and output, before the shift register outputs a valid voltage, a pre-charging voltage having an identical polarity to the valid voltage to an output terminal of the shift register.

5. The GOA circuit according to claim 4, wherein the pre-charging module comprises a second thin film transistor, a third thin film transistor, a fourth thin film transistor and a fifth thin film transistor;
   a pre-charging control signal is input to both a control end and a first end of the second thin film transistor that are connected to each other;
   a control end of the third thin film transistor is connected to a second end of the second thin film transistor, and a first end of the third thin film transistor is connected to the output terminal of the shift register;
   a first end of the fourth thin film transistor is connected to a second end of the third thin film transistor, and both a control end and a second end of the fourth thin film transistor are connected to the PU node; and a control end and a first end of the fifth thin film transistor are connected to each other, and are connected to the second end of the capacitor and the second end of the first thin film transistor; and a second end of the fifth thin film transistor is connected to the output terminal of the shift register.

6. The GOA circuit according to claim 5, wherein a second clock signal serves as the pre-charging control signal, and the second clock signal and the first clock signal are of opposed phases.

7. The GOA circuit according to claim 5, wherein the plurality of shift registers is cascaded, the output terminal of each shift register is connected to one gate line, a second clock signal serves as the pre-charging control signal, and the second clock signal and the first clock signal are of opposed phases.

8. The GOA circuit according to claim 4, wherein the output terminal of each shift register is connected to one gate line, the shift registers connected to odd-numbered rows of the gate lines are cascaded, and the shift register connected to even-numbered rows of the gate lines are cascaded; and
wherein a pre-charging control signal used by one shift register is identical to a clock signal used by a shift register connected to a previous row of gate line.

9. A display device, comprising the GOA circuit according to claim 4.

10. A display device, comprising the GOA circuit according to claim 5.

11. A display device, comprising the GOA circuit according to claim 6.

12. A display device, comprising the GOA circuit according to claim 7.

13. A display device, comprising the GOA circuit according to claim 8.

14. A method for driving a shift register, wherein the shift register comprises a pulling up (PU) node, a capacitor and an output control module, wherein the output control module comprises a first thin film transistor, a control end of the first thin film transistor is connected to a first end of the capacitor via the PU node, a first clock signal is input to a first end of the first thin film transistor, and a second end of the first thin film transistor is connected to a second end of the capacitor; and
the shift register further comprises a pre-charging module, configured to receive a signal from the PU node and output, before the shift register outputs a valid voltage, a pre-charging voltage having an identical polarity to the valid voltage to an output terminal of the shift register;
wherein the method comprises a step of outputting, by the pre-charging module, the pre-charging voltage having the identical polarity to the valid voltage to the output terminal of the shift register, in a pulling-up stage before the shift register outputs the valid voltage.

15. The method according to claim 14, wherein the pre-charging module comprises a second thin film transistor, a third thin film transistor, a fourth thin film transistor and a fifth thin film transistor;
a pre-charging control signal is input to both a control end and a first end of the second thin film transistor that are connected to each other;
a control end of the third thin film transistor is connected to a second end of the second thin film transistor, and a first end of the third thin film transistor is connected to the output terminal of the shift register;
a first end of the fourth thin film transistor is connected to a second end of the third thin film transistor, and both a control end and a second end of the fourth thin film transistor are connected to the PU node; and
a control end and a first end of the fifth thin film transistor are connected to each other, and are connected to the second end of the capacitor and the second end of the first thin film transistor; and a second end of the fifth thin film transistor is connected to the output terminal of the shift register;
wherein the step of outputting, by the pre-charging module, the pre-charging voltage having the identical polarity to the valid voltage to the output terminal of the shift register, in the pulling-up stage before the shift register outputs the valid voltage comprises:
supplying, by the pre-charging control signal via the second thin film transistor and the third thin film transistor, the pre-charging voltage having the identical polarity to the valid voltage to the output terminal of the shift register, in the case that the PU node is pulled up to a high level and the pre-charging control signal is at a high level, wherein the first clock signal is at a low level, the fifth transistor is turned off, a signal at the output terminal of the shift register do not affect a level at the second end of the capacitor, and the capacitor is normally charged by the PU node at this stage; and
stopping, by the pre-charging control signal, supplying the pre-charging voltage to the output terminal of the shift register and supplying, by the first clock signal, the valid voltage to the output terminal of the shift register normally, in the case that the PU node is at a high level, the pre-charging control signal is turned into a low level, the first clock signal is turned into a high level, the third thin film transistor is turned off, and the first thin film transistor and the fifth thin film transistor are turned on.

* * * * *